(12) United States Patent
Hong et al.

(10) Patent No.: US 8,780,507 B2
(45) Date of Patent: Jul. 15, 2014

(54) READ TRANSDUCER AND MAGNETIC STORAGE SYSTEM IMPLEMENTING SAME

(75) Inventors: Ying Hong, Morgan Hill, CA (US); Kochan Ju, Monte Sereno, CA (US); Ching Hwa Tsang, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 1280 days.

(21) Appl. No.: 11/966,003

(22) Filed: Dec. 28, 2007

(65) Prior Publication Data

US 2009/0168263 A1    Jul. 2, 2009

(51) Int. Cl.
*G11B 5/33*    (2006.01)
*G11B 5/127*   (2006.01)

(52) U.S. Cl.
USPC ........................................ 360/324; 360/324.1

(58) Field of Classification Search
USPC .............................................. 360/324, 324.1
See application file for complete search history.

(56) References Cited

U.S. PATENT DOCUMENTS

| | | | |
|---|---|---|---|
| 5,858,455 A | 1/1999 | Chambliss et al. | 427/131 |
| 6,015,632 A | 1/2000 | Chambliss et al. | 428/692 |
| 6,258,470 B1 | 7/2001 | Sakakima et al. | 428/692 |
| 6,340,886 B1 | 1/2002 | Daughton et al. | 324/252 |
| 6,452,762 B1* | 9/2002 | Hayashi et al. | 360/324.1 |
| 6,473,279 B2 | 10/2002 | Smith et al. | 360/324.12 |
| 6,538,856 B1* | 3/2003 | Gill | 360/319 |
| 6,560,077 B2* | 5/2003 | Fujiwara et al. | 360/324.1 |
| 6,562,486 B2 | 5/2003 | Sakakima et al. | 428/692 |
| 6,856,493 B2 | 2/2005 | Pinarbasi | 360/324.11 |
| 6,963,500 B2 | 11/2005 | Tsang | 365/171 |
| 7,027,268 B1 | 4/2006 | Zhu et al. | 360/314 |
| 7,246,427 B2 | 7/2007 | Guo et al. | 29/603.16 |
| 2004/0257714 A1 | 12/2004 | Takahashi et al. | |
| 2006/0002034 A1 | 1/2006 | Li et al. | 360/324.1 |
| 2006/0187590 A1 | 8/2006 | Lin | 360/324.1 |
| 2008/0102316 A1* | 5/2008 | Akimoto et al. | 428/811.2 |

* cited by examiner

*Primary Examiner* — Wayne Young
*Assistant Examiner* — Carlos E Garcia
(74) *Attorney, Agent, or Firm* — Zilka-Kotab, PC

(57) ABSTRACT

A transducer according to one embodiment comprises a first ferromagnetic layer; a second ferromagnetic layer; and an electrically conductive layer positioned between the ferromagnetic layers; wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction, wherein an electrical current enters or exits the end of the first ferromagnetic layer that extends beyond the end of the electrically conductive layer in the first direction. Additional transducer structures, and systems implementing such transducers, are also disclosed.

24 Claims, 7 Drawing Sheets

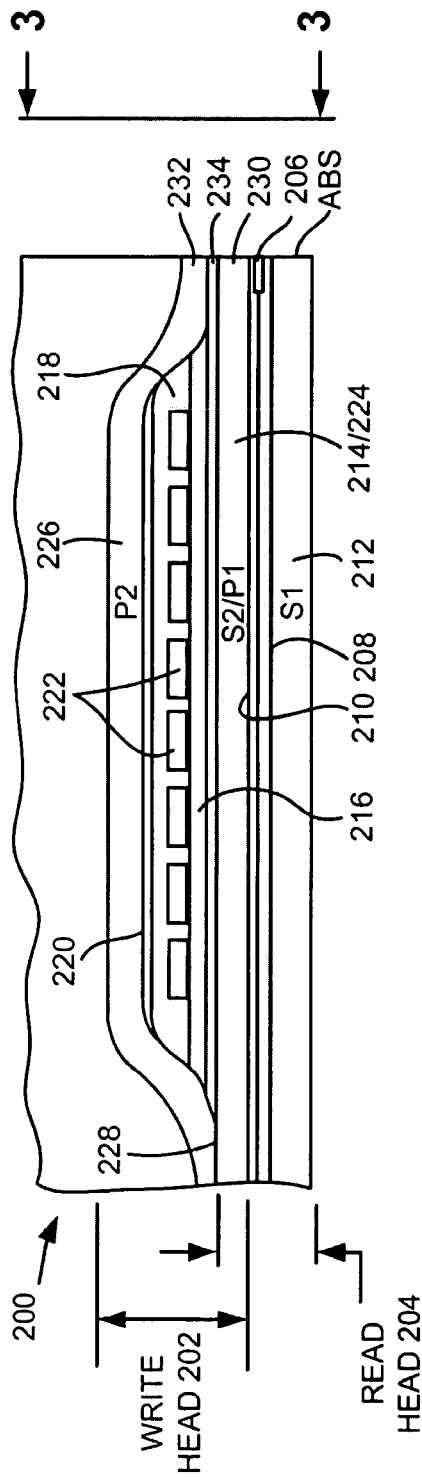
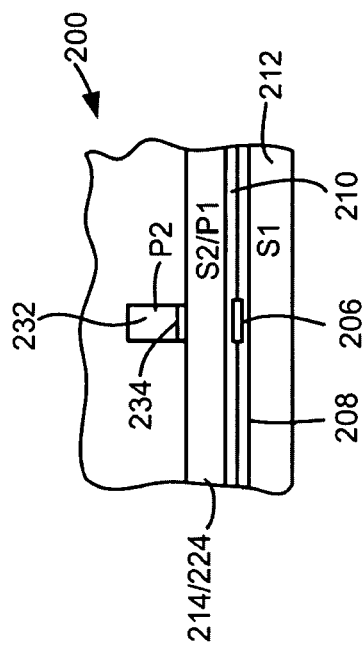
FIG. 2
FIG. 3

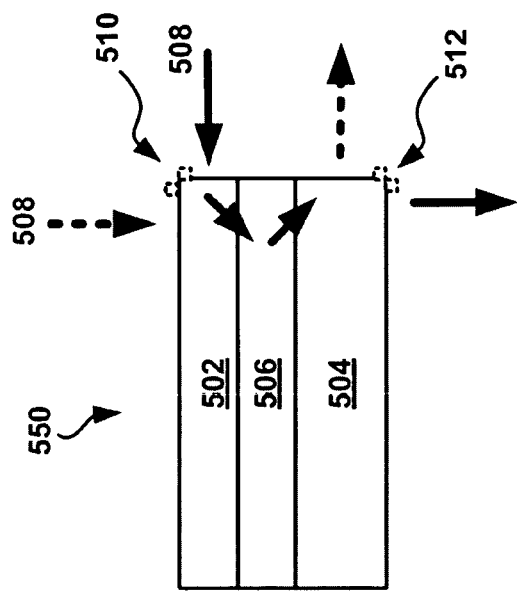
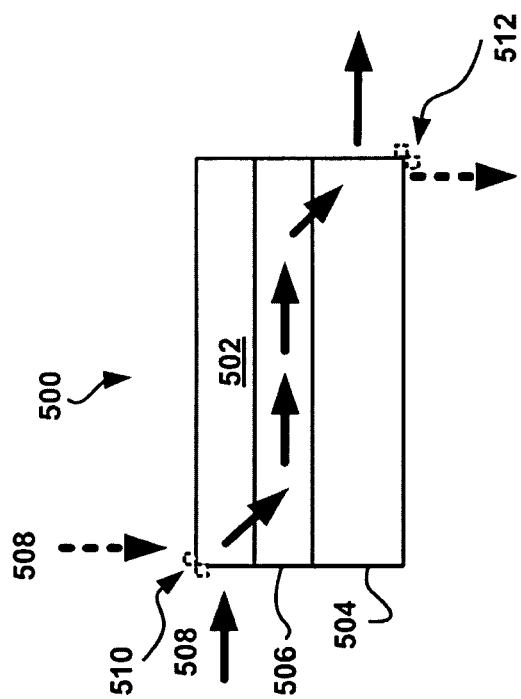
FIG. 5B
FIG. 5A

READ TRANSDUCER AND MAGNETIC STORAGE SYSTEM IMPLEMENTING SAME

FIELD OF THE INVENTION

The present invention relates to magnetic storage systems, and more particularly, this invention relates to transducers combining the characteristics of current perpendicular to plain (CPP) and current in plane (CIP) sensors.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

SUMMARY OF THE INVENTION

A transducer according to one embodiment comprises a first ferromagnetic layer; a second ferromagnetic layer; and an electrically conductive layer positioned between the ferromagnetic layers; wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction, wherein an electrical current enters or exits the end of the first ferromagnetic layer that extends beyond the end of the electrically conductive layer in the first direction.

A transducer according to another embodiment comprises a first ferromagnetic layer; a second ferromagnetic layer; an electrically conductive layer positioned between the ferromagnetic layers; a first electrical lead coupled to the first ferromagnetic layer at a position towards an end of the first ferromagnetic layer, wherein the first electrical lead is not in direct physical contact with the second ferromagnetic layer and electrically conductive layer; and a second electrical lead coupled to the second ferromagnetic layer at a position towards an end of the second ferromagnetic layer, wherein the second electrical lead is not in direct physical contact with the first ferromagnetic layer and electrically conductive layer.

A magnetic storage system according to various embodiments comprises magnetic media; at least one head for reading from and writing to the magnetic media, the at least one head having a sensor (transducer) as described herein; a slider for supporting the head; and a control unit coupled to the head for controlling operation of the head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2 is a partial view of the slider and a merged magnetic head.

FIG. 3 is a partial air bearing surface (ABS) view, not to scale, of the slider taken along plane 3-3 of FIG. 2.

FIGS. 5A and 5B show transducers, in accordance with various embodiments.

DETAILED DESCRIPTION

Figure 1:
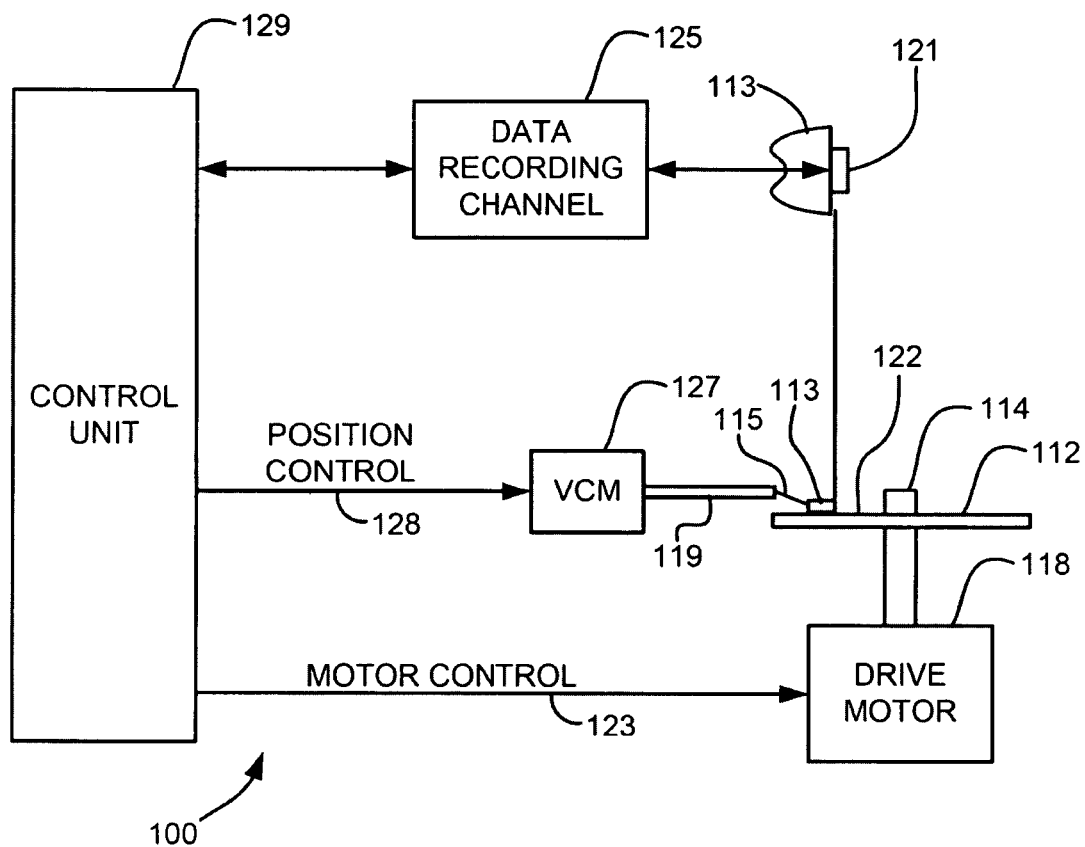
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

The following description discloses several preferred embodiments of data storage systems, as well as operation and/or component parts thereof.

In one general embodiment, a transducer includes a first ferromagnetic layer, a second ferromagnetic layer, and an electrically conductive layer positioned between the ferromagnetic layers. Additionally, a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction, wherein an electrical current enters or exits the end of the first ferromagnetic layer that extends beyond the end of the electrically conductive layer in the first direction.

In another general embodiment, a magnetic storage system includes magnetic media. Additionally, at least one head for reading from and writing to the magnetic media is included, the at least one head having a sensor comprising a first ferromagnetic layer, a second ferromagnetic layer, and an electrically conductive layer positioned between the ferromagnetic layers, wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction, and an electrical current is fed to or received from the end of the first ferromagnetic layer that extends beyond the end of the electrically conductive layer in the first direction. Furthermore, a slider is included for supporting the head. Still yet, a control unit coupled to the head is included for controlling operation of the head.

In still another general embodiment, a transducer includes a first ferromagnetic layer, a second ferromagnetic layer, and an electrically conductive layer positioned between the ferromagnetic layers. Additionally, a first electrical lead coupled to the first ferromagnetic layer at a position towards an end of the first ferromagnetic layer is included, wherein the first electrical lead is not in direct physical contact with the second ferromagnetic layer and electrically conductive layer. Further, a second electrical lead coupled to the second ferromagnetic layer at a position towards an end of the second ferromagnetic layer is included, wherein the second electrical lead is not in direct physical contact with the first ferromagnetic layer and electrically conductive layer.

In yet another general embodiment, a magnetic storage system includes magnetic media. Additionally, at least one head is included for reading from and writing to the magnetic media, the at least one head having a sensor comprising a first ferromagnetic layer, a second ferromagnetic layer, an electrically conductive layer positioned between the ferromagnetic layers, a first electrical lead coupled to the first ferromagnetic layer at a position towards an end of the first ferromagnetic layer, wherein the first electrical lead is not in direct physical contact with the second ferromagnetic layer and electrically conductive layer, and a second electrical lead coupled to the second ferromagnetic layer at a position towards an end of the second ferromagnetic layer, and the second electrical lead is not in direct physical contact with the first ferromagnetic layer and electrically conductive layer. Further, a slider is included for supporting the head. Still yet, a control unit coupled to the head is included for controlling operation of the head.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is in the form of an annular pattern of concentric data tracks (not shown) on the disk 112.

At least one slider 113 is positioned near the disk 112, each slider 113 supporting one or more magnetic read/write heads 121. As the disks rotate, slider 113 is moved radially in and out over disk surface 122 so that heads 121 may access different tracks of the disk where desired data are recorded. Each slider 113 is attached to an actuator arm 119 by means of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 are for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

FIG. 2 is a side cross-sectional elevation view of a merged magnetic head 200, which includes a write head portion 202 and a read head portion 204, the read head portion employing a spin valve sensor 206. FIG. 3 is an air bearing surface (ABS) view of FIG. 2. The spin valve sensor 206 is sandwiched between nonmagnetic electrically insulative first and second read gap layers 208 and 210, and the read gap layers are sandwiched between ferromagnetic first and second shield layers 212 and 214. In response to external magnetic fields, the resistance of the spin valve sensor 206 changes. A sense current ($I_s$) conducted through the sensor causes these resistance changes to be manifested as potential changes. These potential changes may then be processed as readback signals by processing circuitry (e.g. processing circuitry of the control unit 129 shown in FIG. 1).

The write head portion 202 of the magnetic head 200 includes a coil layer 222 sandwiched between first and second insulation layers 216 and 218. A third insulation layer 220 may be employed for planarizing the head to eliminate ripples in the second insulation layer caused by the coil layer 222. The first, second and third insulation layers are referred to in the art as an "insulation stack".

The coil layer 222 and the first, second and third insulation layers 216, 218 and 220 are sandwiched between first and second pole piece layers 224 and 226. The first and second pole piece layers 224 and 226 are magnetically coupled at a back gap 228 and have first and second pole tips 230 and 232 which are separated by a write gap layer 234 at the ABS. Since the second shield layer 214 and the first pole piece layer 224 are a common layer this head is known as a merged head. In a piggyback head, an insulation layer is located between a second shield layer and a first pole piece layer. First and second solder connections (not shown) connect leads (not shown) from the spin valve sensor 206 to leads (not shown) on the slider 113 (FIG. 1), and third and fourth solder connections (not shown) connect leads (not shown) from the coil 222 to leads (not shown) on the suspension.

For current in plane (CIP) giant magnetoresistance (GMR) sensors, current is in the plane of a sensor film included in the sensor stack. A spacer layer, typically comprising non-magnetic noble material, serves to suppress magnetic couplings between the free and the reference layers to allow independent magnetic behaviors for signal field detection. This spacer layer, however, electrically shunts the free and the reference layers which reduces GMR ratio and signal outputs.

In certain cases such as high density applications, current perpendicular to plain (CPP) GMR sensors may be very useful for providing appropriate resistances and robustness against edge damages in small feature devices. In CPP-GMR sensors, current is normal to the plane of the sensor film. As a result, there is no shunting effect from spacer layers included in the sensor. However, in some cases, the use of an antiferromagnetic (AFM) layer for reference layer pinning may create significant additional series resistance, which degrades a GMR ratio and increases joule heating during operation of the sensor. As a result, signal performances of CPP-GMR sensors may not be adequate because of the modest GMR coefficients and spin-torque limits to bias voltages. Thus, it is desirable to implement GMR head designs that incorporate both CPP-GMR and CIP-GMR effects to achieve improvements in the net signal performance. Likewise, it is desirable to implement other types of head designs, e.g., magnetoresistive (MR), anisotropic magnetoresistive (AMR), tunneling magnetoresistive (TMR), etc. that incorporate both CPP-GMR and CIP-GMR effects to achieve improvements in the net signal performance.

Figure 4A:
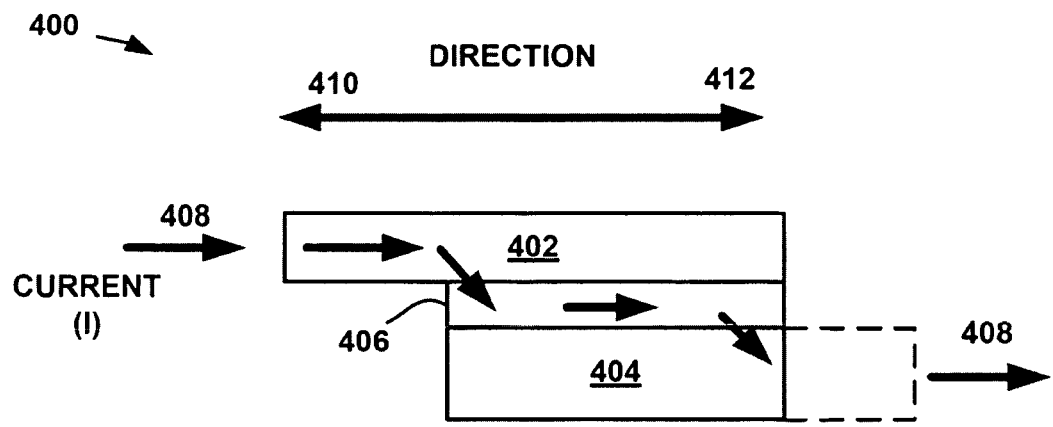
FIGS. 4A, 4B and 4C show transducers, in accordance with various embodiments.
Figure 4B:
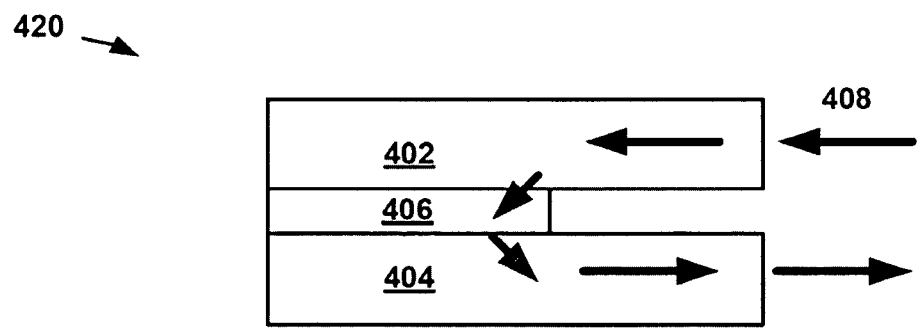
Figure 4C:
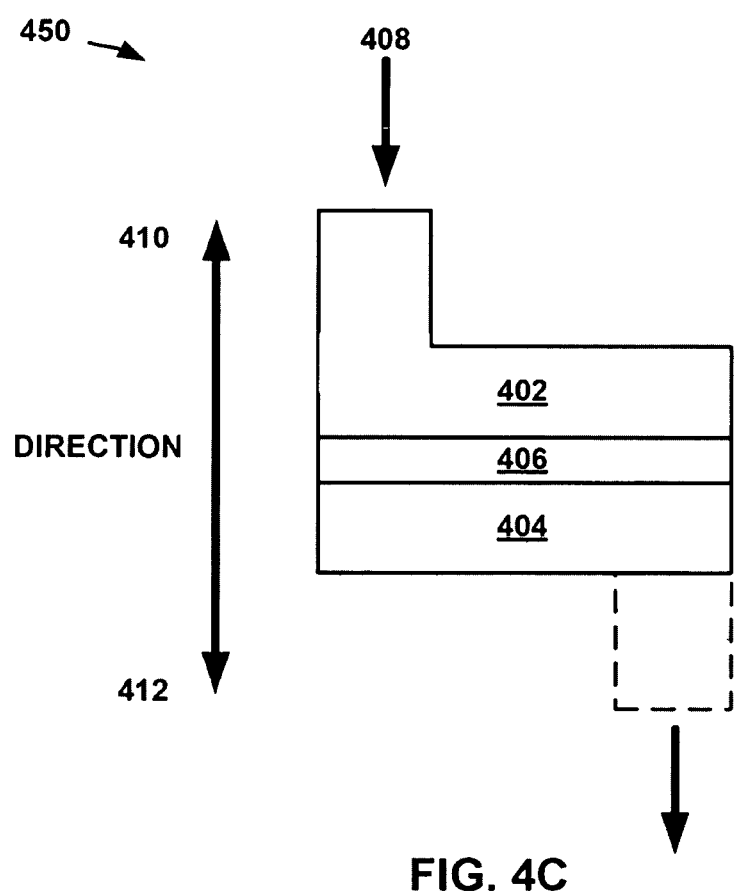

FIGS. 4A, 4B and 4C show transducers 400, 420 and 450, in accordance with various embodiments. As an option, the transducers 400, 420 and 450 may be implemented in the context of the functionality and architecture of FIGS. 1-3. Of course, however, the transducers 400, 420 and 450 may be implemented in any desired environment. It should also be noted that the aforementioned definitions may apply during the present description.

As shown in FIG. 4A, the transducer 400 includes a first ferromagnetic layer 402, a second ferromagnetic layer 404, and an electrically conductive layer 406 positioned between the ferromagnetic layers. In the context of the present description, a transducer may refer to any device capable of converting one thing into another, e.g., a changing magnetic field into a varying signal. In one preferred embodiment, the first ferromagnetic layer 402, the second ferromagnetic layer 404, or both layers 402, 404 are free layers of a magnetic sensor.

With continued reference to FIG. 4A, a length of the first ferromagnetic layer 402 in a first direction 410 parallel to a plane of deposition thereof is greater than a length of the electrically conductive layer 406 in the first direction 410 such that a first end of the first ferromagnetic layer 402 extends beyond an end of the electrically conductive layer 406 in the first direction 410.

As shown further, an electrical current 408 enters (or exits) the end of the first ferromagnetic layer 402 that extends beyond the end of the electrically conductive layer 406 in the first direction 410. In the context of the present description, the end of the first or second ferromagnetic layers 402 and 404 is defined, where applicable, as the entire portion beyond the electrically conductive layer 406 rather than just the end edge of the respective layer. Furthermore, although the first direction 410 is illustrated in one direction in FIG. 4A, the first direction may be in any direction such that the first end of the first ferromagnetic layer 404 actually or equivalently extends beyond the end of the electrically conductive layer 406 in such direction. In other words, the end of the first ferromagnetic layer 404 that extends beyond the end of the electrically conductive layer 406 may actually or equivalently extend beyond such layer in any direction, e.g., as shown in FIGS. 4A, 4B and 4C. See also FIG. 6B, discussed below.

As shown in FIGS. 4A, 4B and 4C, in some embodiments, the length of the second ferromagnetic layer 404 in the second direction 412 is about the same as the parallel length of the conductive layer 406. In other embodiments, as shown in shadow in FIG. 4A, a length of the second ferromagnetic layer 404 in a second direction 412 parallel to a plane of deposition thereof may be greater than a length of the electrically conductive layer 406 in the second direction 412 such that a first end of the second ferromagnetic layer 404 extends beyond an end of the electrically conductive layer 406 in the second direction 412. In this case, the electrical current may enter or exit the end of the second ferromagnetic layer 404 that extends beyond the end of the electrically conductive layer 406 in the second direction 412. In yet other embodiments, as shown in shadow in FIG. 4C, an equivalent length of the second ferromagnetic layer 404 may be greater than a length of the electrically conductive layer 406.

It should be noted that, the second direction may be in any direction such that the first end of the second ferromagnetic layer 404 extends beyond the end of the electrically conductive layer 406 in such direction. For example, the first end of the first ferromagnetic layer 402 and the first end of the second ferromagnetic layer 404 may extend beyond the same end of the electrically conductive layer 406, e.g., as shown in FIGS. 4B and 6B. As an option, the first and second directions 410 and 412 may be perpendicular relative to each other in the vertical and/or horizontal plane. As another option, the first and second directions 410 and 412 may be parallel.

It should also be noted that the extent which the ends of the first and second ferromagnetic layers 402 and 404 extend (actually or equivalently) beyond the electrically conductive layer 406 may vary in different embodiments. For example, in one embodiment, an extent that the first end of the first ferromagnetic layer 402 extends beyond the electrically conductive layer 406 may be greater than an extent that the first end of the second ferromagnetic layer 404 extends beyond the electrically conductive layer 406. In another embodiment, an extent that the first end of the first ferromagnetic layer 402 extends beyond the electrically conductive layer 406 may be less than an extent that the first end of the second ferromagnetic layer 404 extends beyond the electrically conductive layer 406. In still another embodiment, an extent that the first end of the first ferromagnetic layer 402 extends beyond the electrically conductive layer 406 may be the same as, or substantially similar to, an extent that the first end of the second ferromagnetic layer 404 extends beyond the electrically conductive layer 406.

Additionally, in one embodiment, the transducers 400 and 450 may further include a pinning layer (e.g., an AFM layer) for pinning one of the ferromagnetic layers 402 and 404. In this case, the AFM may include any suitable material (e.g. NiO, IrMn, FeMn, CoFe, etc.). Furthermore, the ferromagnetic layers 402 and 404 may include any suitable material (e.g. Co, Fe, Ni, Ge, etc., or any Heusler alloy such as $Co_2MnAl$, $Co_2MnSi$, $Co_2MnGa$, $Co_2MnGe$, etc.) in various embodiments.

As an option, the transducers 400 and 450 may further include hard magnets for stabilizing at least one of the ferromagnetic layers 402 and 404. In one case, one of the ferromagnetic layers 402 and 404 may form part of a synthetic ferrimagnet structure. Furthermore, the electrically conductive layer 406 may be more electrically conductive than the ferromagnetic layers 402 and 404.

As a specific example, the first ferromagnetic layer 402 and the second ferromagnetic layer 404 may include a free layer and a reference layer respectively. In this case, the free layer and the reference layer may overlap at the center region to form a CPP-GMR structure. Additionally, the free layer and the reference layers may also extend beyond the center region on the first side and the second side respectively to form wings displaying CIP-GMR-like functionality. In this case, current may enter the first end of the free layer wing and exit the first end of the reference layer wing. Due to the conductivity of the electrically conductive layer 406, which may be any conductive material, such as Cu, Au, Ag, etc., the electrically conductive layer 406 in the center may function as an equipotential plane, causing the current to be rapidly injected from the free layer into the spacer layer near a first edge of the center region, and then from the electrically conductive layer 406 to the reference layer near a second edge of the center region.

In this way, a CIP-GMR-like effect occurs in one or more of the wing regions for current flowing along the free and reference layers, while a CPP-GMR effect occurs in the center region for current injected from the free layer through the electrically conductive layer 406 to the reference layer (or vice versa). Due to the highly constricted current flow around the ends of the center region, an 'aperture' effect occurs to enhance the CPP-GMR effect. In this case, as a result of the highly non-uniform current flow in the center structure, the resistance contribution of the center structure may be more affected by the thicknesses of the free and the reference layers than by the lateral dimensions (e.g. width and height) of the center region. In this way, substantial increases in the resistance and GMR ratio over a standard CPP-GMR structure of the center region is observed, due to the combination of CIP-GMR effect and aperture-enhanced CPP-GMR effect.

As an option, the transducers 400 and 450 may be utilized in the context of a magnetic storage system including magnetic media, and at least one head for reading from and writing to the magnetic media. In this case, the at least one head may comprise a sensor which includes the transducers 400 and 450. Furthermore, a slider for supporting the head and a control unit coupled to the head may be included for controlling operation of the head.

FIGS. 5A and 5B show transducers 500 and 550, in accordance with another embodiment. As an option, the transducers 500 and 550 may be implemented in the context of the functionality and architecture of FIGS. 1-3. Of course, however, the transducers 500 and 550 may be implemented in any desired environment. It should also be noted that the aforementioned definitions may apply during the present description.

As shown, the transducers 500 and 550 include a first ferromagnetic layer 502, a second ferromagnetic layer 504, and an electrically conductive layer 506 positioned between the ferromagnetic layers 502 and 504. Additionally, a first electrical lead 510 coupled to the first ferromagnetic layer 502 at a position towards an end of the first ferromagnetic layer 502 is included. In this case, the first electrical lead 510 is not in direct physical contact with the second ferromagnetic layer 504 and electrically conductive layer 506. Further, a second electrical lead 512 coupled to the second ferromagnetic layer 504 at a position towards an end of the second ferromagnetic layer 504 is included. In this case, the second electrical lead 512 is not in direct physical contact with the first ferromagnetic layer 502 and electrically conductive layer 506, though are operatively coupled thereto via the second ferromagnetic layer 504.

It should be noted that, although the first and second electrical leads 510 and 512 are illustrated at one end of the first and second ferromagnetic layers 502 and 504, such leads may be at any end of the ferromagnetic layers in various embodiments. It should also be noted that the dimensions of the ferromagnetic layers 502 and 504 may vary in different embodiments. For example, in one embodiment, the first ferromagnetic layer 502 may have about the same dimensions in directions parallel to a plane of deposition thereof as the second ferromagnetic layer 504. In another embodiment, the first ferromagnetic layer 502 may have different dimensions in directions parallel to a plane of deposition thereof from the second ferromagnetic layer 504.

Additionally, in one case, the first electrical lead 510 may be electrically isolated from the second ferromagnetic layer 504 and the electrically conductive layer 506 except through the first ferromagnetic layer 502. In this case, the second electrical lead 512 may be electrically isolated from the first ferromagnetic layer 502 and electrically conductive layer 506 except through the second ferromagnetic layer 504.

As shown, the first electrical lead 510 may be positioned along a side of the first ferromagnetic layer 502, where the side is defined as being between upper and lower planes of deposition of the first ferromagnetic layer 502. As another option, and as shown in FIGS. 5A and 5B, the first electrical lead 510 may be positioned above the first ferromagnetic layer 502. Of course, the positioning of such lead 510 as shown in FIGS. 5A and 5B is exemplary as the positioning of the leads may vary in different embodiments. Similarly, the positioning of the second lead 512 may vary in different embodiments.

Strictly as an option, a length of the first ferromagnetic layer 502 in a first direction parallel to a plane of deposition thereof (e.g. in any direction) may be greater than a length of the electrically conductive layer 506 in the first direction such that a first end of the first ferromagnetic layer 502 extends beyond an end of the electrically conductive layer 504 in the first direction (not shown). In this case, a length of the second ferromagnetic layer 504 in a second direction parallel to a plane of deposition thereof (e.g. in any direction) may be greater than a length of the electrically conductive layer 506 in the second direction such that a first end of the second ferromagnetic layer 504 extends beyond an end of the electrically conductive layer 506 in the second direction (not shown). In this case, the first and second directions may be parallel or perpendicular to each other.

Furthermore, in one embodiment, the first and/or second directions may be in a direction corresponding to the position of the first and/or second electrical lead 510 and 512. For example, if the first electrical lead 510 is positioned above the first ferromagnetic layer 502, the first direction may be perpendicular to the first ferromagnetic layer 502, etc. Furthermore, the first end of the first ferromagnetic layer 502 and the first end of the second ferromagnetic layer 504 may extend beyond the same end of the electrically conductive layer 506.

It should be noted that the extent which the ends of the first and second ferromagnetic layers 502 and 504 extend beyond the electrically conductive layer 506 may vary in different embodiments. For example, in one embodiment, an extent that the first end of the first ferromagnetic layer 502 extends beyond the electrically conductive layer 506 may be greater than an extent that the first end of the second ferromagnetic layer 504 extends beyond the electrically conductive layer 506. In another embodiment, an extent that the first end of the first ferromagnetic layer 502 extends beyond the electrically conductive layer 506 may be less than an extent that the first end of the second ferromagnetic layer 504 extends beyond the electrically conductive layer 506. In still another embodiment, an extent that the first end of the first ferromagnetic layer 502 extends beyond the electrically conductive layer 506 may be the same as, or substantially similar to an extent that the first end of the second ferromagnetic layer 504 extends beyond the electrically conductive layer 506.

Additionally, in one embodiment, the transducers 500 and 550 may further include a pinning layer (e.g., an AFM layer) for pinning one of the ferromagnetic layers 502 and 504. As another option, the transducers 500 and 550 may further include hard magnets for stabilizing at least one of the ferromagnetic layers 502 and 504. In one case, one of the ferromagnetic layers 502 and 504 may form part of a synthetic ferrimagnet structure. Furthermore, the electrically conductive layer 506 may be more electrically conductive than the ferromagnetic layers 502 and 504.

As an option, the transducers 500 and 550 may be utilized in the context of a magnetic storage system including magnetic media, and at least one head for reading from and writing to the magnetic media. In this case, the head(s) may comprise a sensor which includes the transducers 500 and 550. Furthermore, a slider for supporting the head may be included, along with a control unit coupled to the head for controlling operation of the head.

Figure 6A:
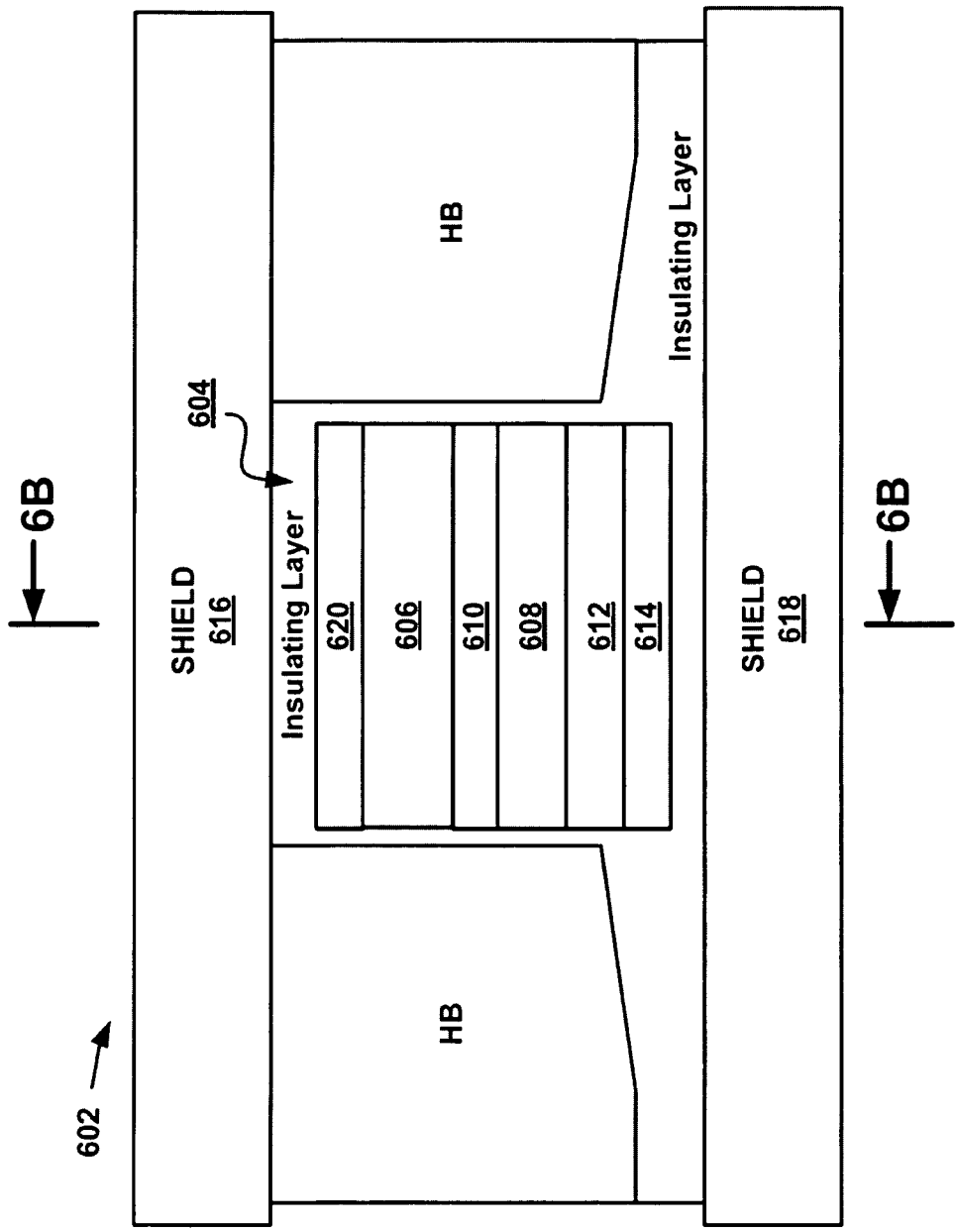
FIG. 6A shows an ABS view of a head for use in a magnetic storage system, in accordance with one embodiment.
Figure 6B:
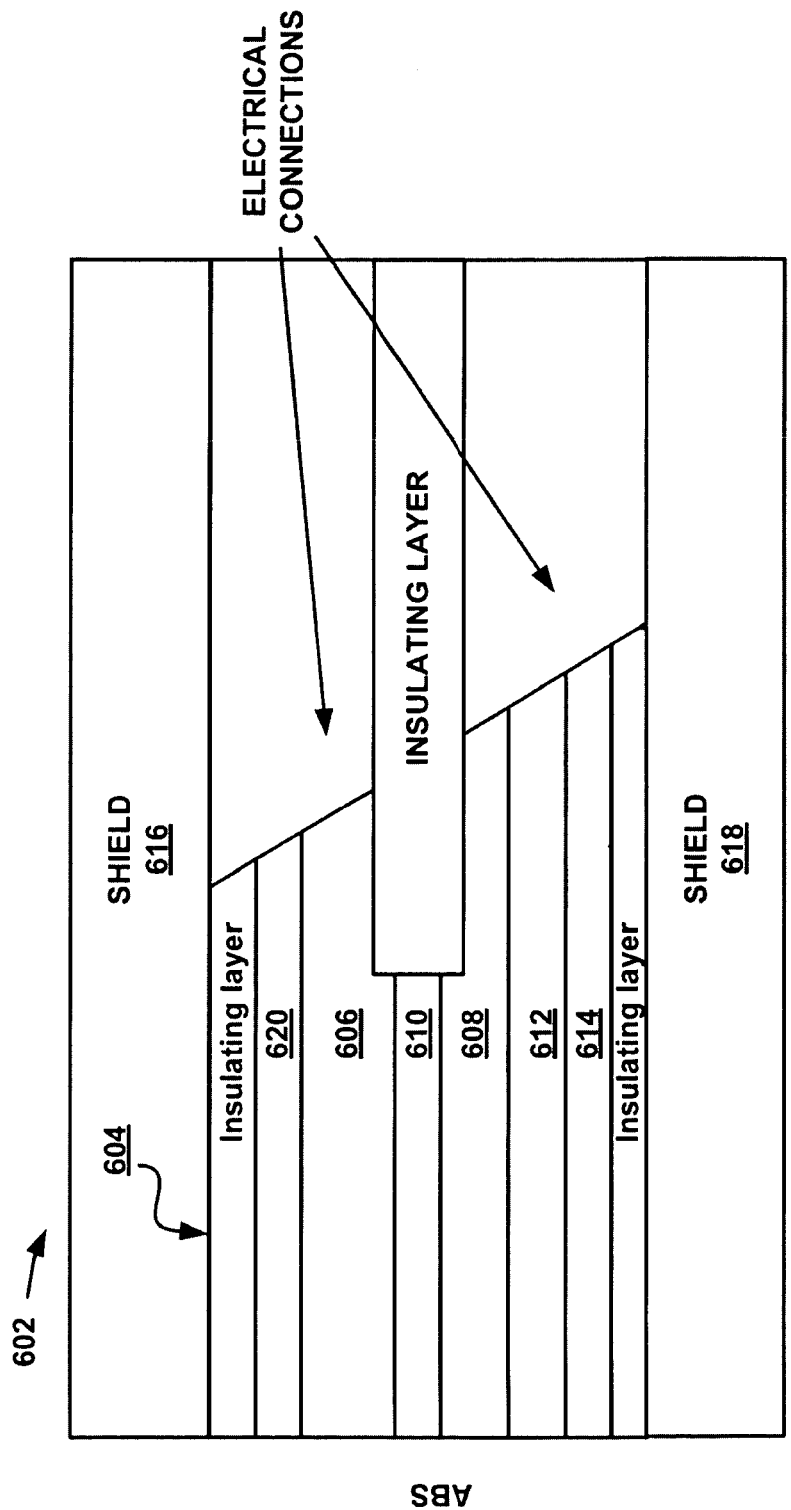
FIG. 6B shows a cross section view taken along line 6B-6B of FIG. 6A.

FIGS. 6A and 6B show an ABS view and a cross section view of a head 602 in one embodiment, and which may be included in a magnetic storage system. As an option, the magnetic storage system may be implemented in the context of the functionality and architecture of FIGS. 1-5. Of course, however, the magnetic storage system may be implemented in any desired environment. It should also be noted that the aforementioned definitions may apply during the present description.

With reference to FIGS. 6A and 6B, the magnetic storage system includes at least one head 602 for reading from and writing to magnetic media (not shown), where the at least one head includes a sensor 604 (e.g. the transducers described in the context of FIGS. 4 and 5) comprising a first ferromagnetic layer 606, a second ferromagnetic layer 608, an electrically conductive layer 610 positioned between the ferromagnetic layers 606 and 608. Additionally, in one embodiment, a first and second electrical lead may be included (not shown), as described in the context of the details of FIG. 5.

In another embodiment, the length of the first and/or second ferromagnetic layer 606 and 608, in a direction parallel to a plane of deposition thereof, may be greater than a length of the electrically conductive layer 610, as described in the context of the details of FIGS. 4 and 5. For example, the first ferromagnetic layer 606 and/or the second ferromagnetic layer 608 of FIG. 6A might extend beyond the end or ends of layer 610 in a direction parallel to the ABS. In FIG. 6B, the ferromagnetic layer 606 and a second ferromagnetic layer 608 extend away from the ABS.

With continued reference to FIGS. 6A and 6B, the sensor 604 may further include a pinning layer 612 (e.g., an antiferromagnetic (AFM) layer) for pinning one of the ferromagnetic layers 606 and 608. A seed layer structure 614 is also shown. Those skilled in the art will appreciate that layers may be added or removed according to the myriad of design possibilities for thin film sensors, any of which may potentially be used with the various embodiments of the present invention.

As a specific example, the second ferromagnetic layer 608 (e.g. a reference layer) may be pinned by an antiferromagnet, either directly or indirectly through a synthetic ferrimagnet structure. The first ferromagnetic layer 606 (e.g. a free layer) may be stabilized by hard magnets at the track edges. The sensor stack 604 may be electrically connected to upper and lower shields 616 and 618 at a back edge, while the front edge at the ABS is electrically insulated. In operation, current may flow in a CIP fashion through the free layer 606 and reference layer 608 wings at the back edge and in a CPP fashion through the sensor stack 604 in front. This two-current model shows significant improvements in GMR ratio due to the sum of aperture enhanced CPP-GMR effects in the front region and CIP-GMR effects in the back region without spacer layer shunting.

While various embodiments have been described above, it should be understood that they have been presented by way of example only, and not limitation. For example, although GMR sensors were discussed such functionality may equally be used in the context of various other types of sensors and/or magnetic storage systems (e.g. tunnel magnetoresistance (TMR) sensors, etc.). Thus, the breadth and scope of a preferred embodiment should not be limited by any of the above-described exemplary embodiments, but should be defined only in accordance with the following claims and their equivalents.

What is claimed is:

1. A transducer, comprising:
   a first ferromagnetic layer;
   a second ferromagnetic layer;
   an electrically conductive layer positioned between the ferromagnetic layers;
   wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction,
   wherein an electrical current enters or exits only the first end of the first ferromagnetic layer that extends beyond the end of the electrically conductive layer in the first direction,
   wherein a length of the second ferromagnetic layer in a second direction parallel to a plane of deposition thereof is greater than a length of the electrically conductive layer in the second direction such that a first end of the second ferromagnetic layer extends beyond an end of the electrically conductive layer in the second direction,
   wherein the electrical current enters or exits only an edge of the first end of the second ferromagnetic layer that faces away from the air bearing surface of the transducer, and
   wherein an extent that the first end of the first ferromagnetic layer extends beyond the electrically conductive layer is greater than an extent that the first end of the second ferromagnetic layer extends beyond the electrically conductive layer.

2. A transducer as recited in claim 1, wherein the first and second directions are parallel.

3. A transducer as recited in claim 2, wherein the first end of the first ferromagnetic layer and the first end of the second ferromagnetic layer extend beyond the same end of the electrically conductive layer.

4. A transducer as recited in claim 1, wherein the first and second directions are perpendicular to an air bearing surface of the transducer.

5. A transducer as recited in claim 1, wherein the end of the first ferromagnetic layer is defined as an entire portion of the first ferromagnetic layer that extends beyond the end of the electrically conductive layer.

6. A transducer as recited in claim 1, wherein one of the ferromagnetic layers forms part of a synthetic ferrimagnet structure.

7. A transducer as recited in claim 1, wherein the electrical current enters or exits only the end of the second ferromagnetic layer that extends beyond the end of the electrically conductive layer in the second direction.

8. A transducer as recited in claim 1, further comprising:
   a first shield positioned near the first ferromagnetic layer on a side of the first ferromagnetic layer opposite a side of the first ferromagnetic layer facing the electrically conductive layer, wherein a first insulating layer is positioned between the first shield and the first ferromagnetic layer; and
   a second shield positioned near the second ferromagnetic layer on a side of the second ferromagnetic layer opposite a side of the second ferromagnetic layer facing the electrically conductive layer, wherein a second insulating layer is positioned between the second shield and the second ferromagnetic layer.

9. A magnetic storage system, comprising:
magnetic media;
at least one head for reading from and writing to the magnetic media, the at least one head having:
  a sensor, comprising:
    a first ferromagnetic layer;
    a second ferromagnetic layer;
    an electrically conductive layer positioned between the ferromagnetic layers;
    a first shield positioned near the first ferromagnetic layer on a side of the first ferromagnetic layer opposite a side of the first ferromagnetic layer facing the electrically conductive layer, wherein a first insulating layer is positioned between the first shield and the first ferromagnetic layer; and
    a second shield positioned near the second ferromagnetic layer on a side of the second ferromagnetic layer opposite a side of the second ferromagnetic layer facing the electrically conductive layer, wherein a second insulating layer is positioned between the second shield and the second ferromagnetic layer;
    wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction,
    wherein an electrical current is fed to or received from the first end of the first ferromagnetic layer that extends beyond the end of the electrically conductive layer in the first direction;
a slider for supporting the head; and
a control unit coupled to the head for controlling operation of the head,
wherein a length of the second ferromagnetic layer in a second direction parallel to a plane of deposition thereof is greater than a length of the electrically conductive layer in the second direction such that a first end of the second ferromagnetic layer extends beyond an end of the electrically conductive layer in the second direction,
wherein the electrical current is fed to or received from only an edge of the first end of the second ferromagnetic layer that faces away from the air bearing surface of the transducer, and
wherein an extent that the first end of the first ferromagnetic layer extends beyond the electrically conductive layer is greater than an extent that the first end of the second ferromagnetic layer extends beyond the electrically conductive layer.

10. A transducer, comprising:
a first ferromagnetic layer;
a second ferromagnetic layer;
an electrically conductive layer positioned between the ferromagnetic layers;
a first electrical lead coupled to the first ferromagnetic layer at a position towards an end of the first ferromagnetic layer, wherein the first electrical lead is not in direct physical contact with the second ferromagnetic layer and electrically conductive layer, wherein an electrical current enters or exits only an edge of the end of the first ferromagnetic layer that faces away from an air bearing surface of the transducer; and
a second electrical lead coupled to the second ferromagnetic layer at a position towards an end of the second ferromagnetic layer, wherein the second electrical lead is not in direct physical contact with the first ferromagnetic layer and electrically conductive layer;
a first shield positioned near the first ferromagnetic layer on a side of the first ferromagnetic layer opposite a side of the first ferromagnetic layer facing the electrically conductive layer, wherein a first insulating layer is positioned between the first shield and the first ferromagnetic layer; and
a second shield positioned near the second ferromagnetic layer on a side of the second ferromagnetic layer opposite a side of the second ferromagnetic layer facing the electrically conductive layer, wherein a second insulating layer is positioned between the second shield and the second ferromagnetic layer,
wherein the electrically conductive layer is more electrically conductive than the ferromagnetic layers.

11. A transducer as recited in claim 10, wherein at least one of the ferromagnetic layers has about the same dimensions in directions parallel to a plane of deposition thereof as the electrically conductive layer.

12. A transducer as recited in claim 10, wherein the first electrical lead is electrically isolated from the second ferromagnetic layer and the electrically conductive layer except through the first ferromagnetic layer, wherein the second electrical lead is electrically isolated from the first ferromagnetic layer and the electrically conductive layer except through the second ferromagnetic layer.

13. A transducer as recited in claim 10, wherein the first electrical lead is positioned along a side of the first ferromagnetic layer, the side being defined between upper and lower planes of deposition of the first ferromagnetic layer.

14. A transducer as recited in claim 10, wherein the first electrical lead is positioned above the first ferromagnetic layer.

15. A transducer as recited in claim 10, wherein a length of the first ferromagnetic layer in a first direction parallel to a plane of deposition thereof is greater than a length of the electrically conductive layer in the first direction such that a first end of the first ferromagnetic layer extends beyond an end of the electrically conductive layer in the first direction, wherein a length of the second ferromagnetic layer in a second direction parallel to a plane of deposition thereof is greater than a length of the electrically conductive layer in the second direction such that a first end of the second ferromagnetic layer extends beyond an end of the electrically conductive layer in the second direction.

16. A transducer as recited in claim 15, wherein the first and second directions are parallel.

17. A transducer as recited in claim 16, wherein the first end of the first ferromagnetic layer and the first end of the second ferromagnetic layer extend beyond the same end of the electrically conductive layer.

18. A transducer as recited in claim 15, wherein the first and second directions are perpendicular to an air bearing surface of the transducer.

19. A transducer as recited in claim 15, wherein the first and second directions are perpendicular to an air bearing surface of the transducer.

20. A transducer as recited in claim 15, wherein an extent that the first end of the first ferromagnetic layer extends beyond the electrically conductive layer is greater than an extent that the first end of the second ferromagnetic layer extends beyond the electrically conductive layer.

21. A transducer as recited in claim 10, wherein the end of the first ferromagnetic layer is defined as an entire portion of the first ferromagnetic layer that extends beyond the end of the electrically conductive layer.

22. A transducer as recited in claim 10, wherein an electrical current enters or exits only an edge of the end of the second ferromagnetic layer that faces away from the air bearing surface of the transducer.

23. A magnetic storage system, comprising:
   magnetic media;
   at least one head for reading from and writing to the magnetic media, the at least one head having:
      a sensor, comprising:
         a first ferromagnetic layer;
         a second ferromagnetic layer;
         an electrically conductive layer positioned between the ferromagnetic layers;
         a first shield positioned near the first ferromagnetic layer on a side of the first ferromagnetic layer opposite a side of the first ferromagnetic layer facing the electrically conductive layer, wherein a first insulating layer is positioned between the first shield and the first ferromagnetic layer;
         a second shield positioned near the second ferromagnetic layer on a side of the second ferromagnetic layer opposite a side of the second ferromagnetic layer facing the electrically conductive layer, wherein a second insulating layer is positioned between the second shield and the second ferromagnetic layer;
         a first electrical lead coupled to the first ferromagnetic layer only at an edge of an end of the first ferromagnetic layer that faces away from an air bearing surface of the sensor, wherein the first electrical lead is not in direct physical contact with the second ferromagnetic layer and electrically conductive layer; and
         a second electrical lead coupled to the second ferromagnetic layer at a position towards an end of the second ferromagnetic layer, wherein the second electrical lead is not in direct physical contact with the first ferromagnetic layer and electrically conductive layer;
      a slider for supporting the head; and
      a control unit coupled to the head for controlling operation of the head,
      wherein the electrically conductive layer is more electrically conductive than the ferromagnetic layers.

24. A magnetic storage system as recited in claim 23, wherein an electrical current enters or exits only the edge of the end of the first ferromagnetic layer that faces away from the air bearing surface.

* * * * *